United States Patent
Wu et al.

(10) Patent No.: US 7,215,686 B2
(45) Date of Patent: May 8, 2007

(54) WAVEGUIDE STRUCTURE HAVING IMPROVED REFLECTIVE MIRROR FEATURES

(75) Inventors: Fang Wu, Ottawa (CA); Adrian O'Donnell, Ottawa (CA)

(73) Assignee: MetroPhotonics Inc., Ontario (CA)

( * ) Notice: Subject to any disclaimer, the term of this patent is extended or adjusted under 35 U.S.C. 154(b) by 0 days.

(21) Appl. No.: 11/409,044

(22) Filed: Apr. 24, 2006

(65) Prior Publication Data

US 2006/0187536 A1 Aug. 24, 2006

Related U.S. Application Data

(62) Division of application No. 10/418,717, filed on Apr. 18, 2003, now Pat. No. 7,035,508.

(51) Int. Cl.
 *H01S 3/30* (2006.01)
(52) U.S. Cl. .......................................................... 372/6
(58) Field of Classification Search ..................... 372/6
 See application file for complete search history.

(56) References Cited

U.S. PATENT DOCUMENTS

| | | | | |
|---|---|---|---|---|
| 6,122,299 | A * | 9/2000 | DeMars et al. ................ | 372/20 |
| 6,335,944 | B1 * | 1/2002 | Mugino et al. ............. | 372/102 |
| 6,335,994 | B1 * | 1/2002 | Kato ............................. | 385/50 |
| 6,389,197 | B1 * | 5/2002 | Iltchenko et al. .............. | 385/28 |
| 6,563,981 | B2 * | 5/2003 | Weisberg et al. .............. | 385/28 |
| 6,600,767 | B1 * | 7/2003 | Lefevre ....................... | 372/108 |
| 6,839,365 | B1 * | 1/2005 | Sonoda et al. ................. | 372/22 |
| 6,987,914 | B2 * | 1/2006 | Savchenkov et al. .......... | 385/50 |
| 7,035,508 | B2 * | 4/2006 | Wu et al. ..................... | 385/43 |
| 7,062,131 | B2 * | 6/2006 | Ilchenko ....................... | 385/50 |
| 7,092,591 | B2 * | 8/2006 | Savchenkov et al. .......... | 385/15 |
| 2002/0028045 | A1 * | 3/2002 | Yoshimura et al. ........... | 385/50 |
| 2002/0039046 | A1 * | 4/2002 | Lipson et al. ................. | 330/56 |

* cited by examiner

*Primary Examiner*—Deandra M. Hughes
(74) *Attorney, Agent, or Firm*—Thomas, Kayden, Horstemeyer & Risley, LLP

(57) ABSTRACT

Integration of laser sources into optoelectronic integrated circuits requires that the laser do not operate using two cleaved end facets. Unfortunately, replacing of one of the end facets results by either a dry etched mirror or by a corner reflectors results in undesirable performance of the laser source since a gain coefficient for the laser source is lower than that for a dual cleaved end facet laser source. A modified waveguide is thus proposed which serves to reduce the undesirable effects found when a corner reflector is used by providing an improved waveguide region between the cleaved end facet and the corner reflector that facilitates excitation of a single optical mode within a laser cavity formed between the corner reflector and the cleaved end facet.

21 Claims, 9 Drawing Sheets

WAVEGUIDE STRUCTURE HAVING IMPROVED REFLECTIVE MIRROR FEATURES

FIELD OF THE INVENTION

The invention relates generally to optical waveguides and more particularly to optical waveguide structures having total internal reflecting mirrors.

BACKGROUND OF THE INVENTION

Fibre optic communication systems have gained widespread acceptance over the past few decades. With the advent of optical fibre, communication signals are transmitted as light propagating along a fibre supporting total internal reflection of the light propagating therein. Many communication systems rely on optical communications because they are less susceptible to noise induced by external sources and are capable of supporting very high speed carrier signals and increased bandwidth. It was found that single mode optical communications systems support a higher rate of data transfer over longer distances. Consequently, single mode optical fibre is now a standard medium for transferring optical signals. Unfortunately, optical fibre components are bulky and often require hand assembly resulting in lower yield and higher costs. One modern approach to automating manufacture in the field of communications is integration. Integrated electronic circuits (ICs) are well known and their widespread use in every field is a clear indication of their cost effectiveness and robustness.

Presently, there is substantial promise in implementing waveguides and optical components within integrated waveguide material. These materials allow for integration of active and passive devices within a same physical substrate. These waveguides are typically formed in semiconductor material where they are often produced using layers of different material to provide a refractive index contrast between the waveguide core and its cladding. Alternatively, relative differences in dopant concentrations can provide small index differences that can be sufficient to provide guiding of an optical signal within a waveguide so formed.

Amongst the active devices that are manufactured into a same physical substrate as optical waveguides are laser sources. These laser sources are manufactured within the same substrate as the waveguide and thus advantageously allow for direct coupling from the laser source to the waveguide. Unfortunately, difficulties arise when these laser sources are manufactured within a same substrate. One such difficulty is forming end facets with the necessary optical qualities. Typically, the end facets of the laser are cleaved which provides a very high quality surface. Unfortunately, cleaving the laser to provide high quality end facets defeats the advantages sought in producing an integrated semiconductor optoelectronic circuit.

It would therefore be advantageous to provide a replacement for the cleaved end facet of the laser source to permit integration of the laser source within an optoelectronic substrate as well as to provide an improved reflection coefficient from the replaced end facet.

SUMMARY OF THE INVENTION

In accordance with the invention, there is provided a waveguide disposed on a substrate comprising: an input port for receiving an optical signal having a first optical mode.

In accordance with an aspect of the invention, there is provided a first waveguide portion having a first optical length coupled to the input port for propagating the optical signal with the first optical mode; a second waveguide portion coupled to the first waveguide portion for receiving the optical signal having the first optical mode and for transforming the optical mode of the optical signal from the first optical mode to a second optical mode along a length of the second waveguide portion; and, a corner reflector optically coupled to the second waveguide portion for receiving the optical signal having the second optical mode from the second waveguide portion and for internally reflecting the second optical mode back into the second waveguide portion, where the optical signal having the second optical mode upon reflection from the corner reflector propagates along the second waveguide portion and therefrom to the first waveguide portion.

In accordance with another aspect of the invention, there is provided a laser source for providing an optical signal having a first optical mode, said laser source disposed on a substrate, comprising: a first partially reflective optical component, the first partially reflective optical component for functioning as an output port; a first waveguide portion having a first optical length for propagating the optical signal with the first optical mode; a second waveguide portion having a second optical length coupled to the first waveguide portion for receiving the optical signal having the first optical mode and for transforming the optical mode of the optical signal from the first optical mode to a second optical mode along a length of the second waveguide portion; a corner reflector optically coupled to the second waveguide portion for receiving the optical signal having the second optical mode from the second waveguide portion and for internally reflecting the second optical mode back into the second waveguide portion, where the optical signal having the second optical mode upon reflection from the corner reflector propagates along the second waveguide portion and therefrom to the first waveguide portion; and, a gain medium, the gain medium disposed along an optical path between the corner reflector and the first partially reflective optical component forming a lasing cavity for the laser source for providing the optical signal having the first optical mode.

In accordance with yet another aspect of the invention, there is provided a method of reflecting an optical signal using an integrated optical substrate comprising the steps of: providing a waveguide having a first waveguide portion and a second waveguide portion, the first and second waveguide portions in optical communication; receiving an optical signal having a first optical mode at an input port disposed at an end of the first waveguide portion; coupling the optical signal to the first waveguide portion for propagation therein in a lowest order single mode; coupling the optical signal in the second waveguide portion for propagation within a region therein in an other than lowest order single mode; reflecting the optical signal with a corner reflector.

BRIEF DESCRIPTION OF THE DRAWINGS

Exemplary embodiments of the invention, will now be described, in conjunction with the drawings, in which:

Prior Art

Prior Art

Prior Art FIG. 3a illustrates a single optical mode propagating within a waveguide strip region towards a prior art corner reflector;

Prior Art FIG. 3b illustrates a single optical mode propagating within a waveguide strip region away from the prior art corner reflector described with reference to FIG. 3a;

DETAILED DESCRIPTION OF THE INVENTION

Figure 1:
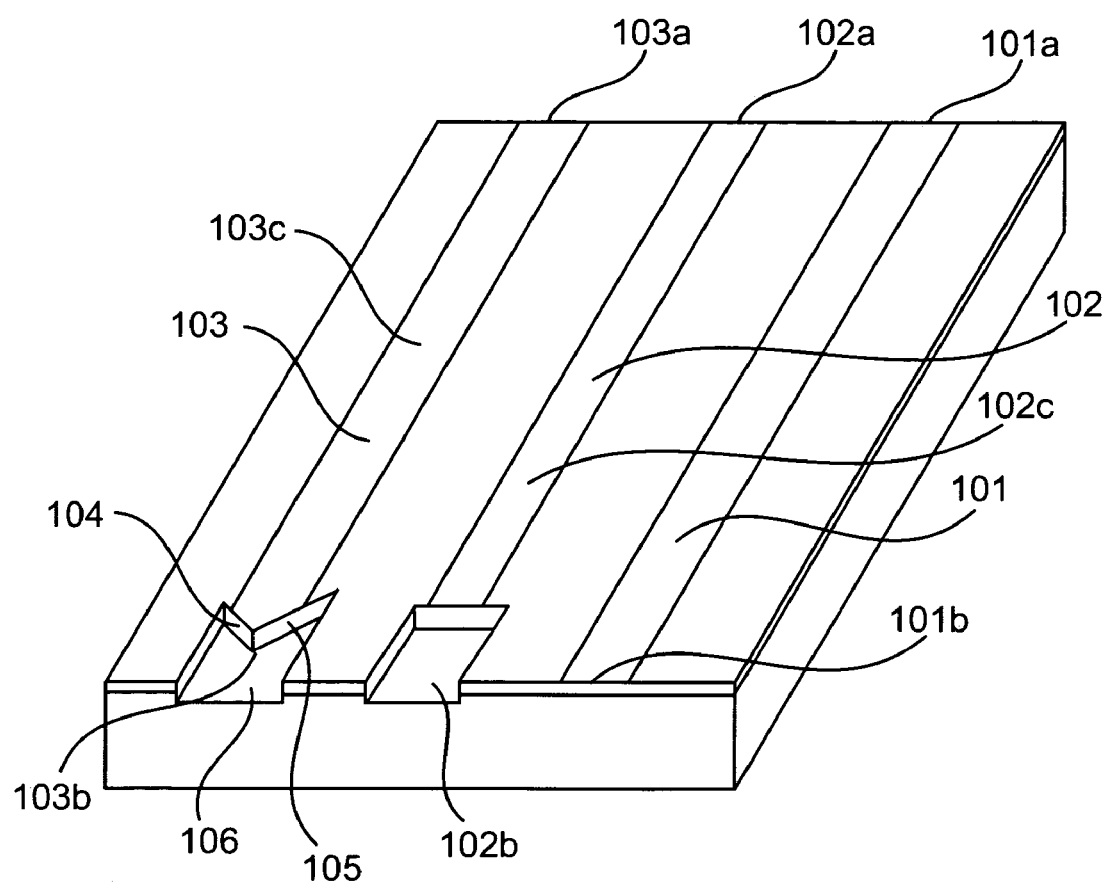
FIG. 1 illustrates three different types of prior art integrated laser sources.

FIG. 1 illustrates three different types of prior art integrated laser sources. A first laser source 101 has a first cleaved end facet 101a and a second cleaved end facet 101b. These two end facets and a waveguide strip region form a lasing cavity for the laser source, where between these facets a gain medium is disposed within the waveguide strip region, which when provided with electrical energy causes lasing within the waveguide strip. The cleaved end facets provide an adequate reflection coefficient for the laser source to facilitate providing an output optical signal therefrom. Typically, one of the cleaved end facets has a lower reflectivity than the other and as a result light from the laser source is emitted from that facet. The emitted light from this facet typically follows an optical energy distribution that has an approximately Gaussian optical energy beam profile. The optical signal emitted from the laser source thus has a single transverse optical mode, or in terminology familiar to those of skill in the art, is "single mode". Other optical modes, or transverse beam profiles of the optical signal, are also possible in dependence upon the waveguide strip geometry. For larger widths of the waveguide strip connecting the end facets, the optical signal tends to follow a multi mode distribution, where the optical mode typically has more than one peak in the transverse beam profile. In order to preserve signal integrity it would be beneficial to provide a more accurate reflection with minimal disruption of the optical signal as it is reflected.

Unfortunately, laser sources with cleaved end facets are not easily integrated into an optoelectronic integrated circuit (OIEC). A second laser source 102 has a first cleaved end facet 102a and a second straight etched end facet 102b where these two end facets and a waveguide strip region 102c therebetween form a lasing cavity for the laser source.

To those of skill in the art it is known that in order to eliminate cleaved end facets anisotropic dry etching techniques are used. Unfortunately, with the use of dry etching techniques the laser sources manufactured as a result thereof still generate an output optical signal at both ends of the laser, and they generally exhibit higher threshold currents than cleaved facet lasers due to surface roughness as a result of the dry etch. Thus having one of the end facets of the laser straight etched is not advantageous, although it permits integration of the laser source within the OEIC.

In order to obtain single ended output from a laser source 103 manufactured within the OEIC, a corner reflector (CR) 103b typically replaces one of the straight etched end facets. A waveguide strip region 103c is disposed between a first cleaved end facet 103a and a second end facet 103b in the form of a CR. The CR typically has smooth sidewalls with a reasonably sharp corner with a corner radius of approximately 1.25 microns. Between the cleaved end facet 103a and the CR 103b the waveguide strip region acts a gain medium that has a gain coefficient that characterizes the laser source in terms of an amount of electrical energy that is converted into optical energy to form the optical signal emitted at the cleaved end facet. The corner reflector advantageously provides for increased reflection of the photons within the lasing cavity between the facets 103a and 103b.

In use the CR facilitates reflecting of a portion of the optical signal by an optical process of total internal reflection (TIR). For lasers manufactured containing GaAs materials, TIR is observed between the waveguide containing the gain medium and air interface for incidence angles of greater than 17 degrees.

To those of skill in the art it is known that the facet reflectivity and scattering for the etched facet devices can be approximated using mathematical formulas. Thus, following from mathematical approximations, the straight-etched facets typically exhibit a reflectivity of 12% and a scattering loss of 63%, while etched CRs typically exhibit a reflectivity of 53% and a scattering loss of 44%. The decrease in scattering loss is typically attributed to the recapture of some of the scattered light by the etched CR. Although, cleaved end facets provide increased reflectivity, using a CR is a significant improvement over the straight etched end facet.

To those of skill in the art it is known that the single optical mode 201 has a majority of its optical power located in a center peak of the optical mode. However, when the single optical mode reflects from the corner reflector, the single optical mode is transformed into a multi-mode optical signal because of the corner portion of the corner reflector created between two straight etched angled portions 104 and 105 making up the CR. The corner portion 106 scatters a portion of light from within the center peak of the optical mode upon reflection. Thus, reflecting from a corner reflector favours optical modes other than the desired lowest order single mode, especially when these modes are emitted from the laser source. As previously mentioned, it would be preferable to have a reflector that provides a reflected signal that is substantially equivalent to the signal that was incident on the reflector.

Figure 2:
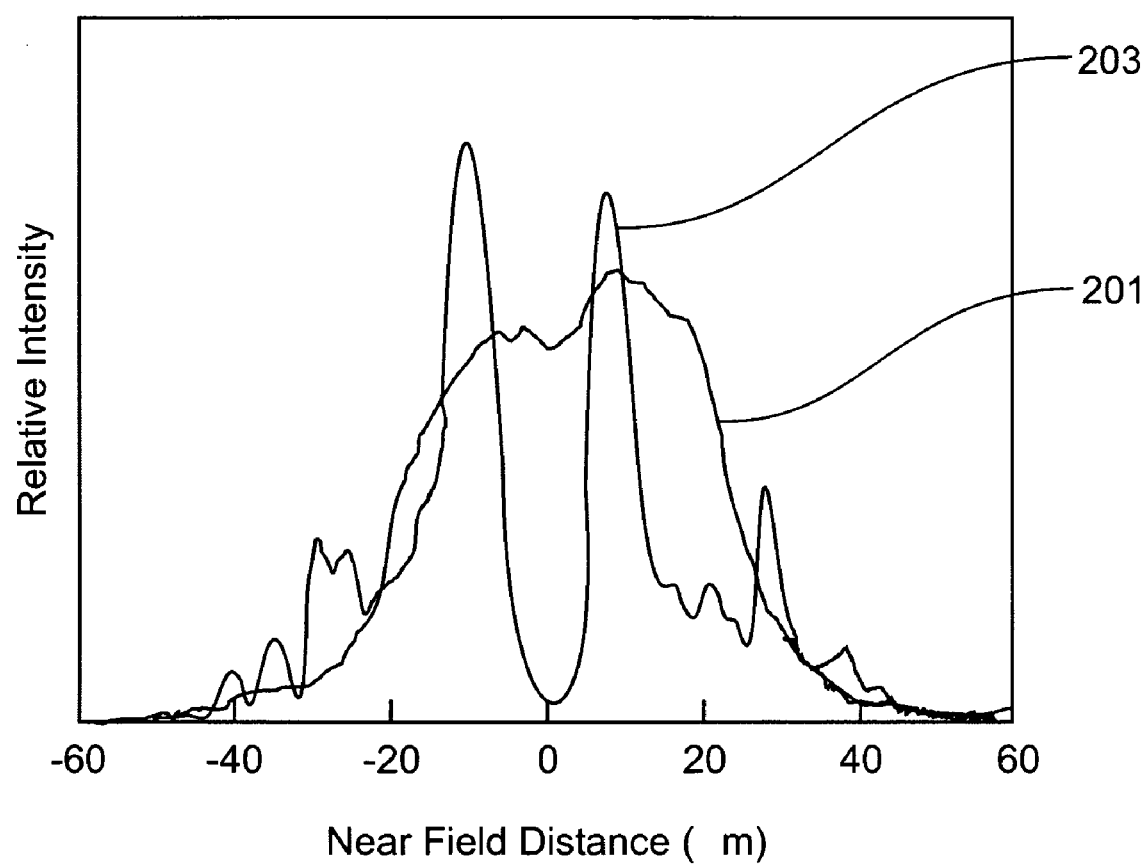
FIG. 2 illustrates the near field pattern in terms of position and optical intensity for light emitted from two prior art laser sources.

FIG. 2 illustrates the near field pattern in terms of position and optical intensity for light emitted from the laser sources analogous to the laser sources 101 and 103 described with reference to FIG. 1. A beam profile of the optical signal emitted from the dual cleaved end facet laser source 101 is shown in trace 201 and a beam profile of the optical signal emitted from the laser source 103 having the CR is shown in trace 203. From this graph it is evident that the near field pattern observed for the laser source having two cleaved end facets is approximately Gaussian in shape and having a majority of optical power from the laser source located approximately at a center of the optical signal. For the cleaved end facet and CR laser source the near field pattern is not as ideal for use with single mode waveguides. The etched CR unfortunately facilitates lasing of optical modes other than the desired lowest order single mode within the laser cavity waveguide strip region. Unfortunately, as a result of the design of this laser source 103, in order to satisfy phase matching criteria at this pair of turning mirrors 104 and 105 making up the CR, and to account for optical loss due to emission at the corner of the CR 106, the optical mode operating within the waveguide strip region is other than the desired lowest order single mode.

Figures 3A, 3B:
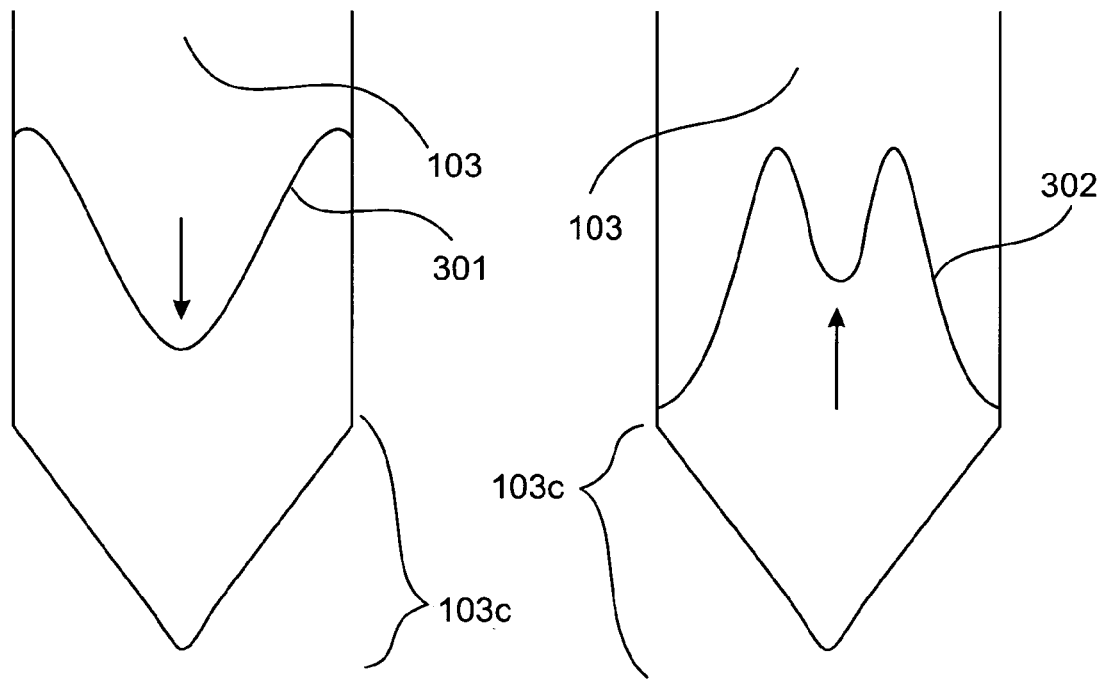

FIG. 3a illustrates a single optical mode 301 propagating within the waveguide strip region 103 towards the CR 103c. Referring to FIG. 3b, upon reflection of the optical mode from the CR 103c, the optical mode no longer has a single mode beam profile but now has a multi mode profile 302, and in this case the optical mode is termed "odd ordered". Unfortunately, odd ordered modes such as these do not easily couple into optical fibers or into other single mode devices. Thus having this odd ordered optical mode optical signal is not advantageous since it adds complications when the laser source is integrated with other single mode components within OEICs. It is known to those of skill in the art that single mode operation for optical device is preferable since a majority of the optical devices receive single optical modes and propagate single optical mode signals therefrom. Furthermore, operation of the laser source in this odd-ordered optical mode decreases the gain coefficient, thus offering inferior performance to an end facet laser source but providing for easy integration into an OEIC compliant package.

Figure 4:
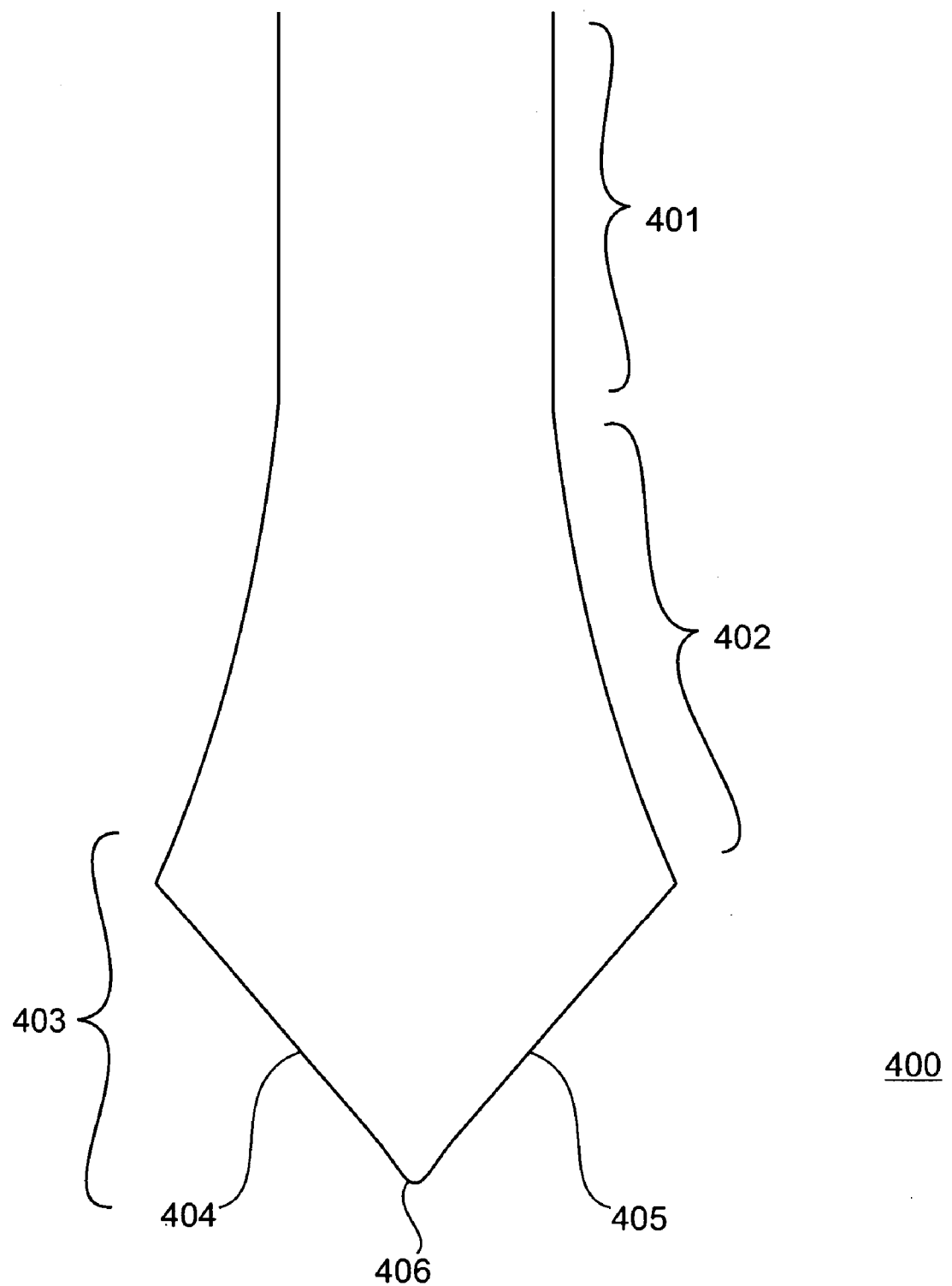
FIG. 4 illustrates an embodiment of the invention, an improved waveguide design having a corner reflector that facilitates reflection of a multi mode optical signal therefrom.
Figure 5A:
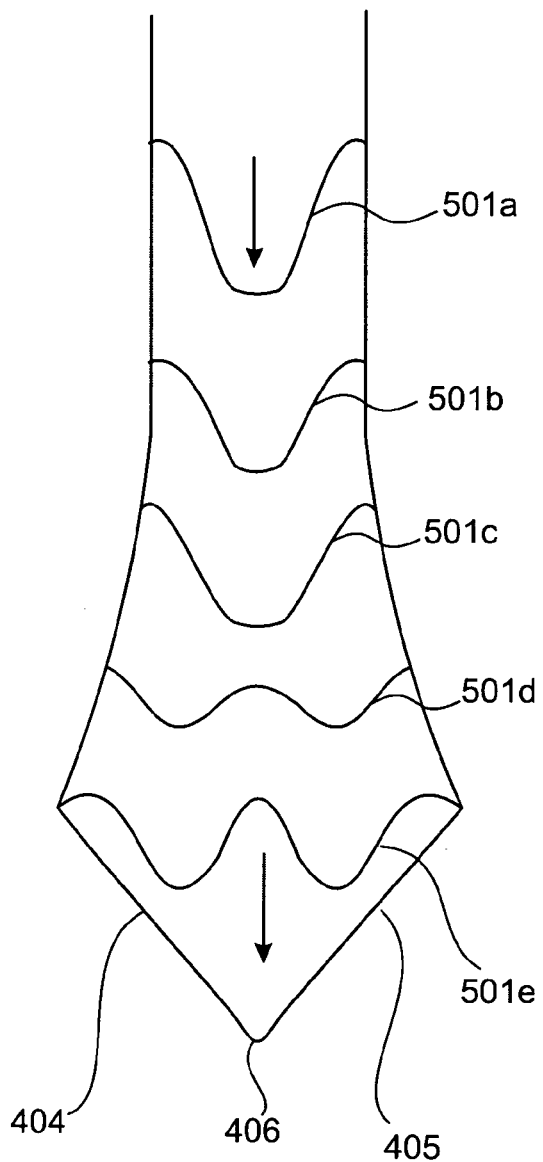
FIG. 5a illustrates an embodiment of the invention with demonstrates an optical signal propagating to a corner reflector.
Figure 5B:
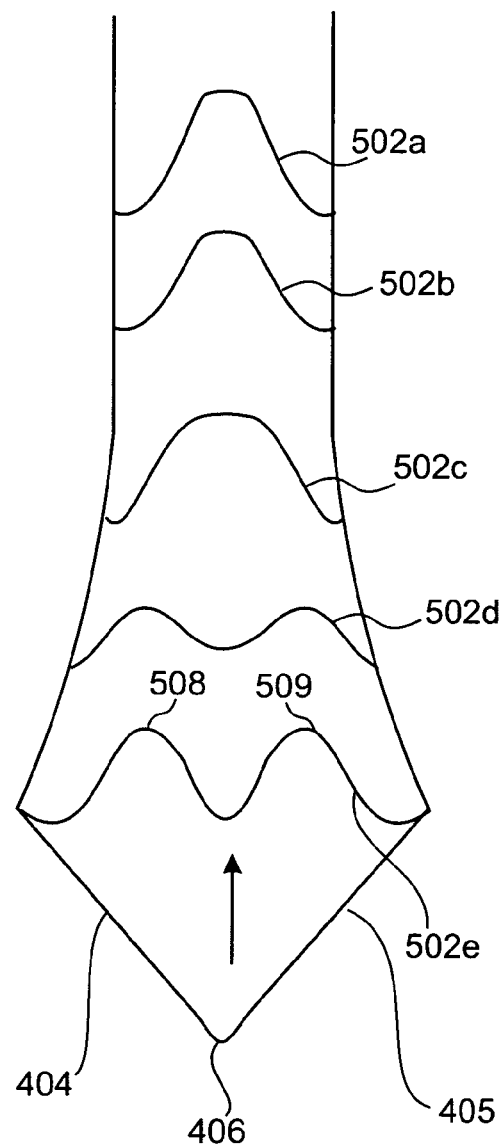
FIG. 5b illustrates the embodiment of the invention shown in FIG. 5a with an optical signal propagating from a corner reflector.

FIG. 4, illustrates an embodiment of the invention, an improved waveguide design 400 having a corner reflector 403 that facilitates reflection of a multi mode optical signal therefrom. The improved waveguide design has dual waveguide portions. A first waveguide portion 401 is designed to propagate a single optical mode along its length. This first waveguide portion 401 is extended into a second waveguide portion 402. The second waveguide portion 402 is designed to propagate other than a single mode, and preferably an odd ordered transverse mode having dual optical power peaks. At an end of this second waveguide portion a CR 403 is disposed having two straight etched turning mirrors reflectors 404 and 405 and a corner 406 therebetween, similar to that shown in FIG. 1. The CR 403 is for reflecting of the other than a single optical mode therefrom. In FIG. 5a and FIG. 5b, the reflection of the optical mode is exemplified. Referring to FIG. 5a, an optical signal having a single optical mode 501a is shown propagating to a device according to the design described with reference to FIG. 4. The single optical mode 501a propagates through the first waveguide portion and in the second waveguide portion it is transformed into a multi mode 501e at an end of the second waveguide portion proximate the CR 403. Optical modes 501b, 501c and 501d are illustrative of the transformation from the single optical mode 501a to the multi mode 501e. Referring to FIG. 5b, upon reflection form the CR 403, the multimode 502e propagates through the second waveguide portion 402 and as it propagates along the optical mode is transformed by nature of the waveguide design back into a single mode 502a. Optical modes 502d, 502c and 502b are illustrative of the transformation of the mode that occurs as the optical signal propagates within the waveguide device.

By advantageously providing a multi mode optical mode having preferably two optical power distribution peaks 508 and 509 to the CR, optical losses associated with the corner 506 of the CR are significantly reduced. Since a majority of the optical power is found in these two peaks 508 and 509, this optical power reflects from the first and second turning mirrors 504 and 505 and a significantly lower portion of the optical power found in the optical mode illuminates the corner 506 of the CR and hence a lesser portion of the optical power of the optical mode is lost as compared to a signal optical mode reflecting from the CR as taught in the prior art of FIG. 3.

Figure 6:
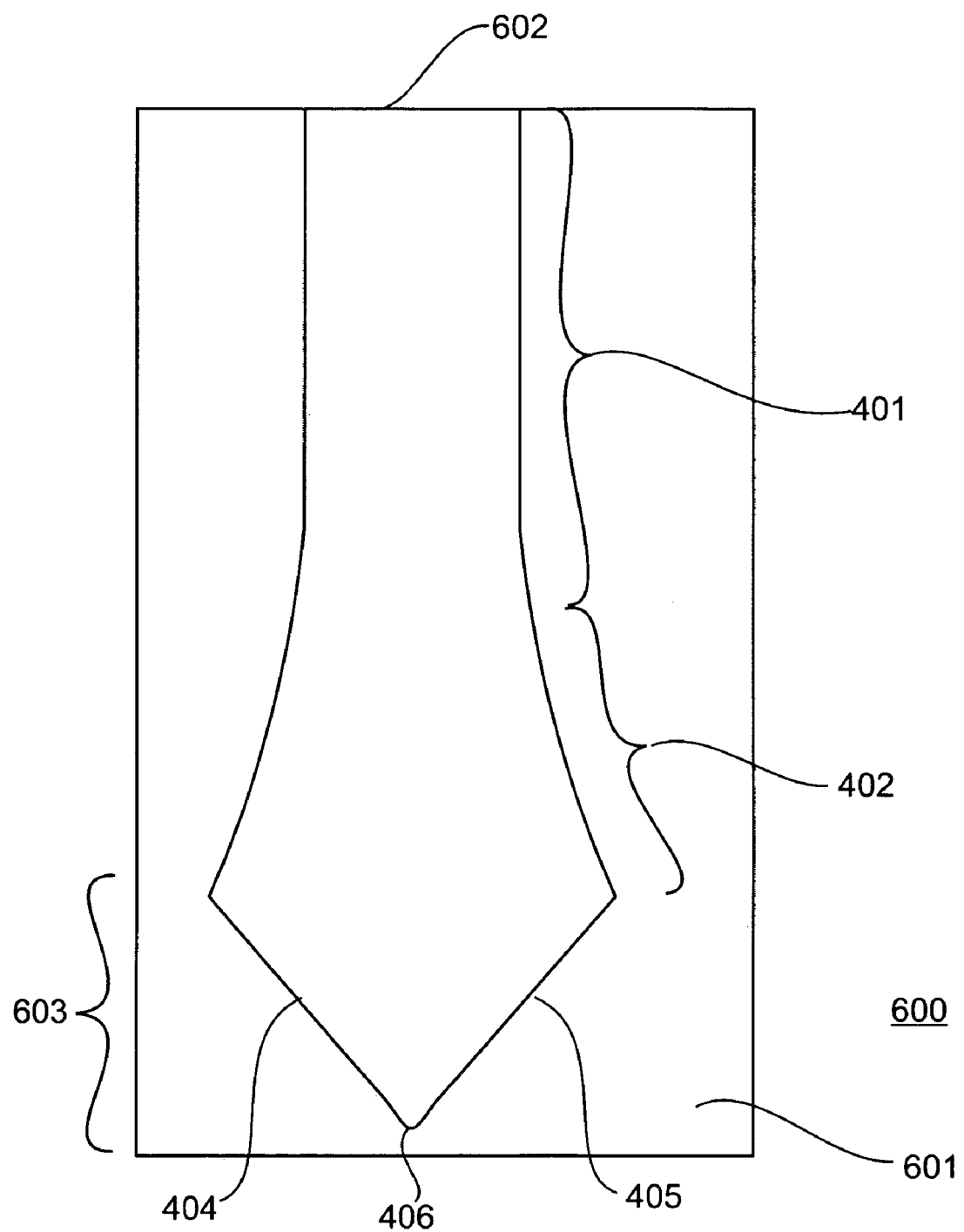
FIG. 6 another embodiment of the invention is shown where a corner reflector is used within a laser source manufactured on a semiconductor substrate.

Referring to FIG. 6 another embodiment of the invention is shown. In this embodiment the improved CR design is used within a laser source 600 manufactured on a semiconductor waver. A cleaved end facet, 602, first and second waveguide portions 401 and 402, as well as a CR 603 make up the laser cavity for the laser source. An optical path length between the cleaved end facet 602 and the CR 603 determine the wavelength of the optical signal output from the laser source. The first and second waveguide portions are doped in such a manner as to provide an optical gain to a portion of the optical signal in response to electrical input to permit lasing action within the laser source for facilitating the propagation of the output signal from the laser source. Advantageously, because a multi mode beam is provided to the CR, the optical mode output from the laser source follows a single mode Gaussian profile and is not multi mode as demonstrated in the prior art. Thus, the improved laser source shown in FIG. 6 is easily integrated into optical devices that utilize single mode optical signals. Optionally, the end facet 602 is chemically deep etched when the corner reflector 603 is etched. Since chemical deep etching provides very accurate dimensional control, the length of the lasing cavity is precisely controlled. Additionally, the step of cleaving is avoided thereby reducing costs.

Figure 7:
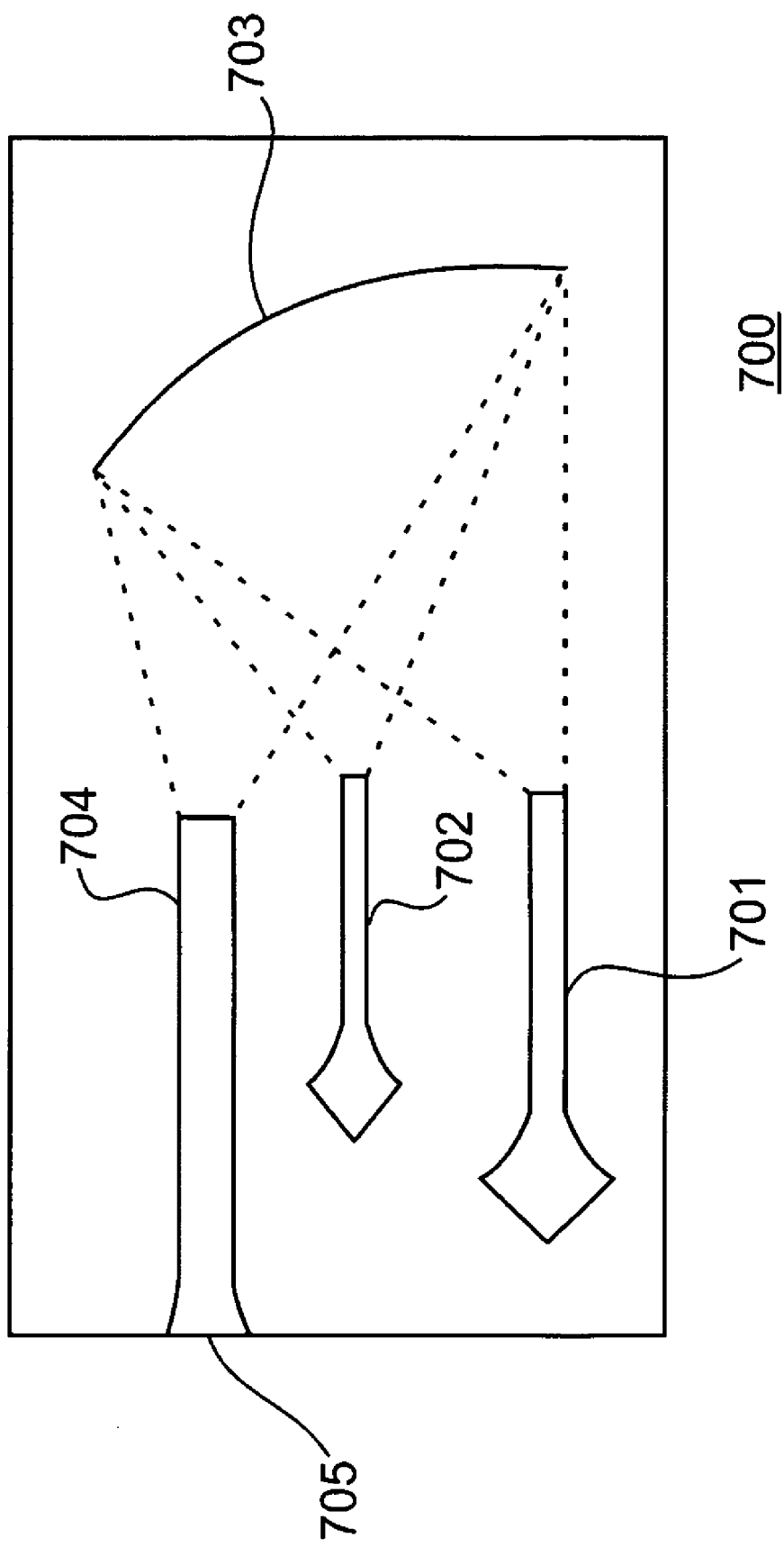
FIG. 7 illustrates dual laser sources utilized within an optoelectronic integrated circuit.

In FIG. 7, dual laser sources 701 and 702 as shown in FIG. 6, are utilized within an OEIC 700. In this case the laser sources 701 and 702 have two different optical lengths of the waveguide regions between the end facet and the CR. Thus each of these laser sources provides a different wavelength output signal at the end facet thereof. The OEIC device using the dual laser sources functions as a multiplexer, where the optical output signals from each of the laser sources illuminates an integrated wavelength dispersive element 703 in the form of an echelle grating. The wavelength dispersive element 703 combines the two optical signals from the laser sources into a single multiplexed output signal. This multiplexed output signal is provided to an output waveguide 704 in optical communication with the wavelength dispersive element and furthermore to an output port 705 on the OEIC 700. Of course, a partially reflective end facet of the output waveguide along with the laser sources and the echelle grating, in addition with a gain medium, optionally form a multistripe array grating integrated cavity (MAGIC) laser.

Advantageously, by providing an improved CR for use in, for example, a laser source, improved gain coefficients are realized for the laser sources since more optical power is provided from the source with respect to a same amount of current applied to the waveguide region acting as the optical gain medium disposed between the end facet and the CR. Whereas in the prior art a significant amount of light is lost from the optical signal because of the peak of the optical mode being centered on the corner of the CR. The improved laser source additionally facilitates easy integration into OEIC components because of not having dual cleaved end facets and hence is more easily integrated into the OEIC without many additional wafer processing steps.

This embodiment is particularly advantageous because the echelle grating 703 is formed using a deep etching process. Thus, the echelle grating 703 and the corner reflectors are provided in a same product step further reducing costs.

Figure 8:
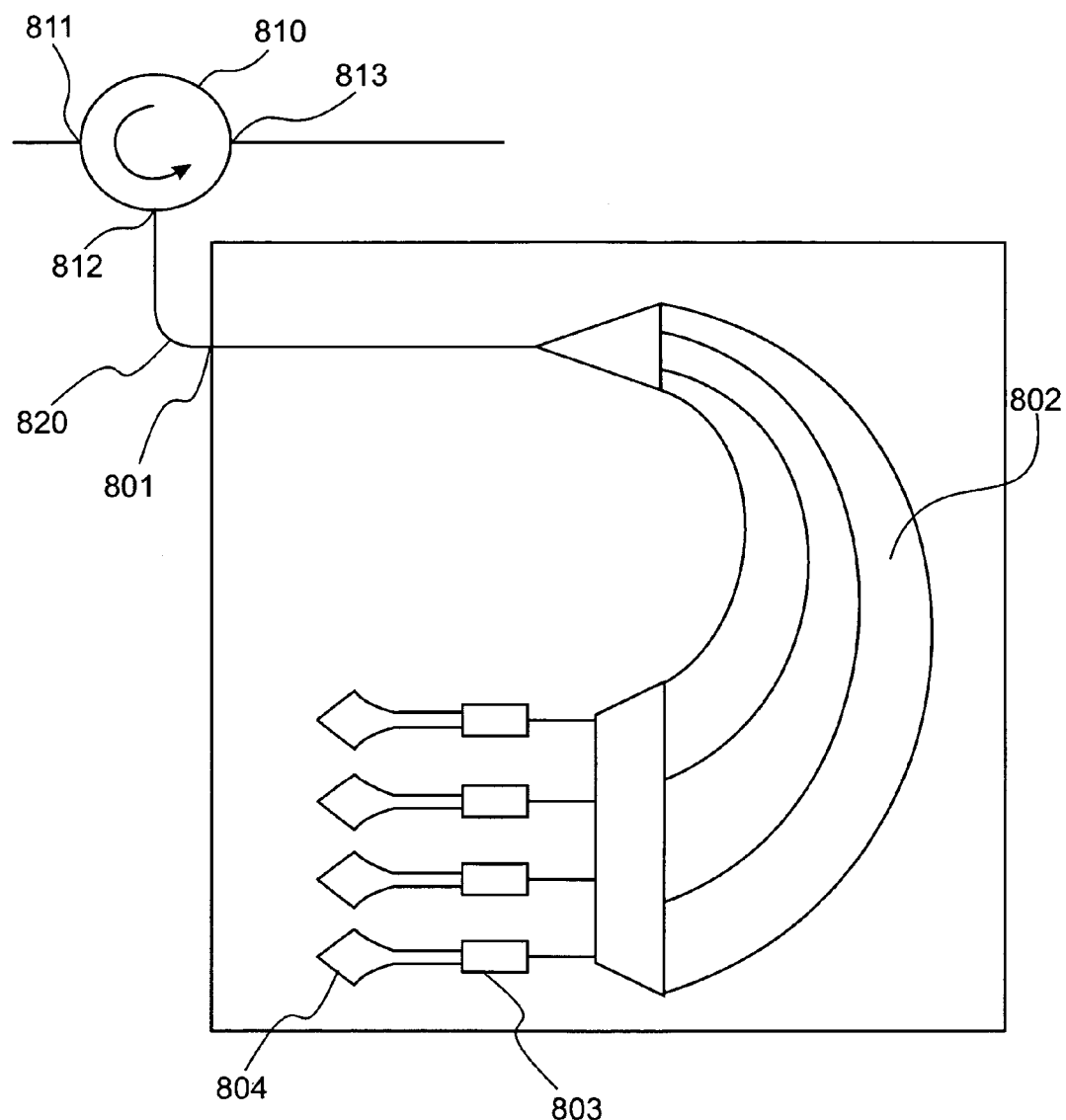
FIG. 8 illustrates a variable optical attenuator.

Referring to FIG. 8, a variable optical attenuator is shown. The attenuator includes an integrated substrate with an input port 801, an arrayed waveguide grating 802, a set of variable optical attenuators 803, and a set of reflectors 804 according to the invention. Additionally, that attenuator features an optical circulator 810 having a first port 811, a second port 812 and a third port 813 as well as a single mode optical fibre 820 for optically coupling the second port 812 of the circulator to the input port 801 of the integrated attenuator substrate. In operation, a wavelength multiplexed optical signal is received by the first port 811 of the optical circulator 810 and provided at the second port 812. The wavelength multiplexed optical signal then propagates along the single mode fibre 820 and is received by the input port 801 of the integrated substrate. The wavelength multiplexed optical signal is separated into a variety of optical signals, each corresponding to a predetermined wavelength channel supported by the arrayed waveguide grating. Each of the optical signals corresponding to a predetermined wavelength channel is provided to one attenuator 803 and a reflector 804. The attenuator 803 varies the optical power of the optical signal. The reflector then causes the optical signal to propagate back to the arrayed waveguide grating 802. The arrayed waveguide grating combines the attenuated optical signals and provides a wavelength multiplexed optical signal at the input port 801. The wavelength multiplexed optical signal propagates along the fibre 820 and is optically coupled to the second port 812 of the circulator 810. The circulator then provides the optical signal to the third port 813. Since there is an optical attenuator for each of the supported predetermined wavelength channels, the wavelength multiplexed optical signal provided by the arrayed waveguide grating 802 has an intensity profile that depends upon the amount of attenuation provided by each of the attenuators.

Figure 9:
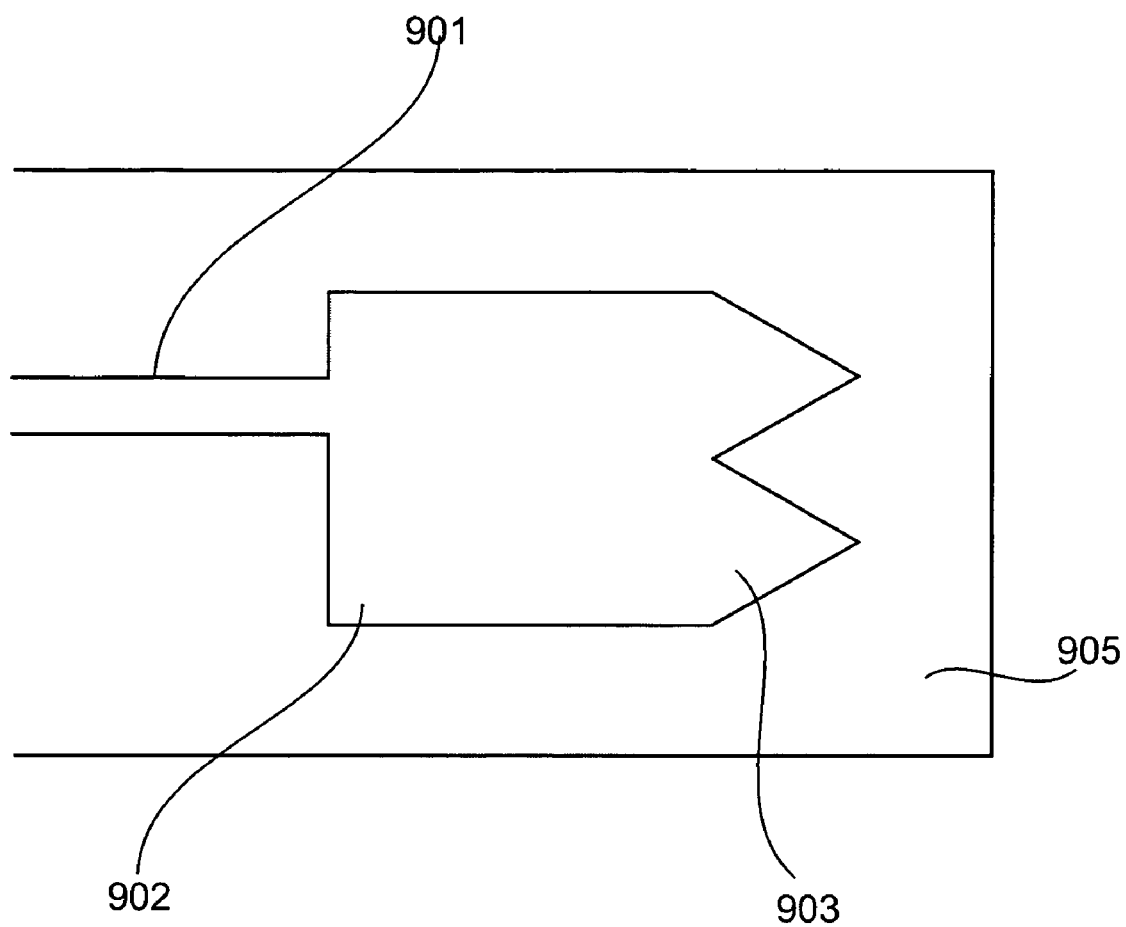
FIG. 9 is a top view of an embodiment of the invention featuring two corner reflectors.

Referring to FIG. 9 a top view of an alternative embodiment of the invention is shown. The illustrated device includes a single mode waveguide 901, a multi-mode waveguide 902, a set of reflective facets 903 all provided on a waveguide substrate 905. In use, light propagating within the single mode waveguide 901 in provided to the multi-mode waveguide 902. The propagation of the light within the multi-mode waveguide 902 causes excitation of the higher order modes. The length of the multi-mode waveguide 902 has been chosen to provide a good mode profile to the reflective facets. The reflective facets are well suited to reflecting optical signals incident on their face and less well suited to reflecting optical signals proximate the intersections of the facets. This particular embodiment of the invention is intended for exciting and reflecting a multiple of four modes. Clearly, other embodiments of the invention supporting other numbers of modes are easily envisioned by one of skill in the art of waveguide design. As is clearly demonstrated by the prior art of Jenkins et al. in U.S. Pat. No. 5,410,625 a shorter length of multi-mode waveguide will result in four peaks in comparison with the length associated with two peaks. This allows the reflector to be substantially shorter than an alternative embodiment of the invention that supports only two peaks. Additionally, as can be seen, the light enters the multi-mode waveguide 902 somewhat off-axis. This advantageously enhances excitation of the higher order modes, however it is likely to cause a higher level of attenuation when the optical signal is coupled back into the single mode waveguide. Thus, the length of the multi-mode waveguide 902 should be carefully chosen to provide the desired optical characteristics.

One of skill in the art of optical component design will be aware that the invention is useful in a wide variety of applications in which integrated substrates incorporate reflectors and is not limited to the examples provided above. Clearly, the invention is useable with both buried waveguides and ridge waveguides although the processes used in creating the reflector will likely vary with the type of waveguide used.

Numerous other embodiments can be envisaged without departing from the spirit or scope of the invention.

What is claimed is:

1. A laser source for providing an optical signal having a first optical mode, said laser source disposed on a substrate, comprising:
   a first partially reflective optical component, the first partially reflective optical component for functioning as an output port;
   a first waveguide portion having a first optical length for propagating the optical signal with the first optical mode;
   a second waveguide portion having a second optical length coupled to the first waveguide portion for receiving the optical signal having the first optical mode and for transforming the optical mode of the optical signal from the first optical mode to a second optical mode along a length of the second waveguide portion;
   at least a corner reflector optically coupled to the second waveguide portion for receiving the optical signal having the second optical mode from the second waveguide portion and for internally reflecting the second optical mode back into the second waveguide portion, where the optical signal having the second optical mode upon reflection from the corner reflector propagates along the second waveguide portion and therefrom to the first waveguide portion; and,
   a gain medium, the gain medium disposed along an optical path between the corner reflector and the first partially reflective optical component forming a lasing cavity for the laser source for providing the optical signal having the first optical mode.

2. A laser source according to claim 1, wherein each of the at least a corner reflector comprises:
   a first turning mirror;
   a second turning mirror joined at a corner to the first turning mirror for forming the corner reflector, wherein the first and the second turning mirrors are in optical communication with the second waveguide portion such that a fraction of an optical signal propagating from the first waveguide portion and within the second waveguide portion will be reflected from the first turning mirror to the second turning mirror.

3. A laser source according to claim 2, wherein the waveguide is a buried waveguide and the first waveguide portion and the second waveguide portion comprise:
   a core region and a cladding region;
   where a cross sectional area of the core region proximate the at least a corner reflector of the second waveguide portion is larger than a cross sectional area of the core of the first waveguide portion.

4. A laser source according to claim 3, wherein the second waveguide portion has a variation in optical index of refraction between the core region and the cladding region, the optical index of refraction having reduced contrast between the core region and the cladding region within the second waveguide portion relative to the contrast of optical index of refraction of the first waveguide portion.

5. A laser source according to claim 4, wherein the increased cross section is formed by a step of diffusion such that diffusion occurs for increasing the cross sectional area along two orthogonal dimensions and for reducing the contrast in index of refraction.

6. A laser source according to claim 1, wherein the first optical mode comprises a lowest order single optical mode.

7. A laser source according to claim 1, wherein the second optical mode comprises other than a lowest order single optical mode.

8. A laser source according to claim 7, wherein the other than a lowest order single optical mode is an odd-ordered optical mode.

9. A laser source according to claim 1, wherein the waveguide is a ridge waveguide and the first waveguide portion corresponds to a first width of the ridge and the second waveguide portion corresponds to a second width of the ridge which is at least as wide as the first width of the ridge.

10. A laser source according to claim 1, wherein the waveguide is integrated into an optoelectronic circuit.

11. A laser source according to claim 2, wherein each of the first and the second turning mirrors are fabricated within the substrate using a dry etch process.

12. A laser source according to claim 7, wherein the optical signal having other than a lowest order single optical mode has a mode characterized in that it has at least two optical intensity peaks.

13. A laser source according to claim 12, wherein none of the optical intensity peaks is incident an intersection of any two turning mirrors.

14. A laser source according to claim 13, wherein the turning mirrors are disposed such that a local optical intensity minimum associated with an optical signal propagating from the first waveguide portion is incident proximate the intersection of two turning mirrors.

15. A laser source according to claim 1, wherein the wavelength of the optical signal is provided at a predetermined value.

16. A laser source according to claim 1, wherein the first optical mode comprises a lowest order single optical mode.

17. A laser source according to claim 1, wherein the second optical mode comprises other than a lowest order single optical mode.

18. A laser source according to claim 17, wherein the other than a lowest order single optical mode is an odd-ordered optical mode.

19. A laser source according to claim 1, wherein the first partially reflective optical component is an end facet.

20. A laser source according to claim 1, wherein the first partially reflective optical component is a wavelength selective optical component.

21. A laser source according to claim 1, wherein the laser source is a multistripe array grating integrated cavity laser.

* * * * *